US012572786B2

(12) United States Patent
Kumar et al.

(10) Patent No.: US 12,572,786 B2
(45) Date of Patent: Mar. 10, 2026

(54) NVM-BASED HIGH-CAPACITY NEURAL NETWORK INFERENCE ENGINE

(71) Applicant: International Business Machines Corporation, Armonk, NY (US)

(72) Inventors: Arvind Kumar, Chappaqua, NY (US); Kyu-hyoun Kim, Chappaqua, NY (US); Ramachandra Divakaruni, Ossining, NY (US); Jeffrey Lyn Burns, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 946 days.

(21) Appl. No.: 17/218,440

(22) Filed: Mar. 31, 2021

(65) Prior Publication Data

US 2022/0318603 A1 Oct. 6, 2022

(51) Int. Cl.
| | |
|---|---|
| *G06F 12/00* | (2006.01) |
| *G06F 9/48* | (2006.01) |
| *G06N 3/063* | (2023.01) |
| *G11C 5/14* | (2006.01) |

(52) U.S. Cl.
CPC ........... *G06N 3/063* (2013.01); *G06F 9/4806* (2013.01); *G11C 5/14* (2013.01)

(58) Field of Classification Search
CPC .................................................. G06F 9/4806
USPC ........................................................ 711/100
See application file for complete search history.

(56) References Cited

U.S. PATENT DOCUMENTS

| | | | |
|---|---|---|---|
| 10,467,527 B1 | 11/2019 | Margaglia | |
| 10,534,736 B1 * | 1/2020 | Reghunath | ............. G09G 5/026 |
| 10,755,783 B2 | 8/2020 | Tran | |
| 11,734,175 B2 * | 8/2023 | Jin | ........................ G06F 3/0679 |
| | | | 711/162 |

(Continued)

FOREIGN PATENT DOCUMENTS

| | | |
|---|---|---|
| CN | 109814927 A | 5/2019 |
| CN | 117063148 A | 11/2023 |

(Continued)

OTHER PUBLICATIONS

International Search Report and Written Opinion, International Application No. PCT/CN2022/084030, International Filing Date Mar. 30, 2022.

(Continued)

*Primary Examiner* — Mohamed M Gebril
(74) *Attorney, Agent, or Firm* — Edward J. Wixted, III

(57) ABSTRACT

A system, method, and computer program product for a neural network inference engine is disclosed. The inference engine system may include a first memory and a processor in communication with the first memory. The processor may be configured to perform operations. The operations the processor is configured to perform may include fetching a first task with said first memory and delivering the first task to the processor for processing the first task. The operations may further include prefetching a second task with the first memory while the processor is processing the first task. The operations may further include the first memory delivering the second task to the processor upon completion of processing the first task. The operations may further include the processor processing the second task.

18 Claims, 10 Drawing Sheets

100

(56) References Cited

U.S. PATENT DOCUMENTS

| | | | |
|---|---|---|---|
| 2008/0005646 A1* | 1/2008 | Bains | G06F 11/1008 |
| | | | 714/E11.034 |
| 2013/0103889 A1* | 4/2013 | Jeong | G06F 12/0246 |
| | | | 711/E12.008 |
| 2013/0166931 A1 | 6/2013 | Castagnetti | |
| 2015/0199126 A1* | 7/2015 | Jayasena | G06F 12/0292 |
| | | | 711/170 |
| 2015/0199275 A1* | 7/2015 | Radhakrishnan | G06F 12/0862 |
| | | | 711/137 |
| 2015/0227469 A1* | 8/2015 | Zyulkyarov | G06F 12/0895 |
| | | | 711/207 |
| 2017/0168846 A1* | 6/2017 | Li | G06F 3/0673 |
| 2017/0177044 A1* | 6/2017 | Limaye | G06F 1/324 |
| 2019/0042930 A1 | 2/2019 | Pugsley | |
| 2019/0196953 A1 | 6/2019 | Gu | |
| 2019/0205736 A1 | 7/2019 | Bleiweiss | |
| 2019/0206494 A1 | 7/2019 | Han | |
| 2019/0235789 A1* | 8/2019 | Yan | G06F 3/0656 |
| 2019/0259732 A1* | 8/2019 | Choo | G11C 5/063 |
| 2020/0117400 A1 | 4/2020 | Golov | |
| 2020/0117597 A1* | 4/2020 | Huang | G06N 3/063 |
| 2020/0126974 A1* | 4/2020 | Liu | H10D 62/292 |
| 2020/0151539 A1 | 5/2020 | Oh | |
| 2020/0242460 A1 | 7/2020 | Tran | |
| 2020/0272560 A1 | 8/2020 | Keeth | |
| 2021/0263671 A1* | 8/2021 | O | G06F 3/061 |
| 2022/0197641 A1* | 6/2022 | Azadet | G06F 9/30036 |

FOREIGN PATENT DOCUMENTS

| | | | |
|---|---|---|---|
| DE | 112022001129 T5 | 1/2024 |
| JP | 2009-540477 A | 11/2009 |
| JP | 2024-513377 A | 3/2024 |
| WO | 2008/005781 A2 | 1/2008 |
| WO | 2019/212688 A1 | 11/2019 |
| WO | 2022/206828 A1 | 10/2022 |

OTHER PUBLICATIONS

Chien, et al., "Reliability study of a 128Mb phase change memory chip implemented with doped Ga—Sb—Ge with extraordinary thermal stability." Published in 2016. Downloaded Jan. 4, 2021. In 2016 IEEE International Electron Devices Meeting (IEDM). pp. 21.1.1-21.1.4 San Francisco, CA. doi: 10.1109/IEDM.2016. 7838463.

Lue, et al., "A Novel 3D AND-type NVM Architecture Capable of High-density, Low-power In-Memory Sum-of-Product Computation for Artificial Intelligence Application." Published in 2018. Downloaded Jan. 5, 2021. In IEEE Symposium on VLSI Technology. pp. 177-178. Honolulu, HI. doi: 10.1109/VLSIT.2018. 8510688.

Mell, et al., "The NIST Definition of Cloud Computing," Recommendations of the National Institute of Standards and Technology, U.S. Department of Commerce, Special Publication 800-145, Sep. 2011, 7 pgs.

Japan Patent Office, "Notice of Reasons for Refusal" Jun. 17, 2025, 09 Pages, JP Application No. 2023-560055.

* cited by examiner

300

340

400

440

<u>600</u>

700

900

NVM-BASED HIGH-CAPACITY NEURAL NETWORK INFERENCE ENGINE

BACKGROUND

The present disclosure relates generally to the field of memory and, more specifically, data retrieval from memory.

Neural networks place increasingly significant demand on memory subsystems. This is especially true for deep neural networks (DNNs) given growing model sizes and datasets. Off-chip memory access is frequently energy consuming, time consuming, and requires a large packaging form factor. Thermal challenges may also place restrictions on memory systems and memory technology used within systems.

SUMMARY

Embodiments of the present disclosure include a system, method, and computer program product for a neural network inference engine. In some embodiments of the present disclosure, the inference engine system may include a first memory and a processor in communication with the first memory. The processor may be configured to perform operations. The operations the processor is configured to perform may include fetching a first task with said first memory and delivering the first task to the processor for processing the first task. The operations may further include prefetching a second task with the first memory while the processor is processing the first task. The operations may further include the first memory delivering the second task to the processor upon completion of processing the first task. The operations may further include the processor processing the second task.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
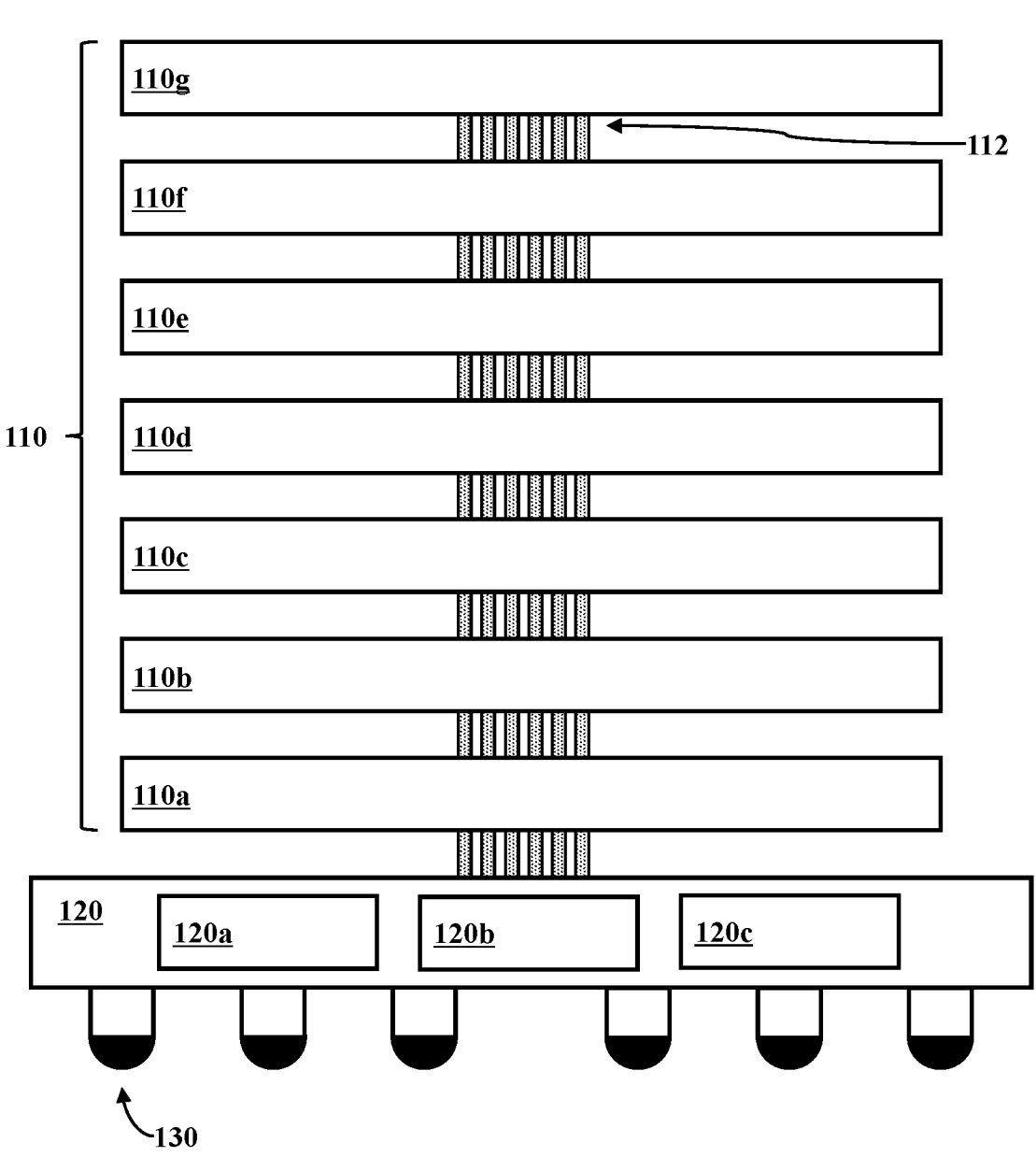
FIG. 1 illustrates a memory stack in accordance with the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

The present disclosure relates generally to the field of digital memory and, more specifically, data retrieval from memory. Additional aspects of the present disclosure will be apparent to those skilled in the art. Some of these aspects are described further below.

Embodiments of the present disclosure include a system, method, and computer program product for a non-volatile memory-based high-capacity neural network inference engine. Some embodiments may be particularly useful in deep neural network applications. In some embodiments of the present disclosure, the inference engine system may include a first memory and a processor in communication with the first memory. The processor may be configured to perform operations. The operations the processor is configured to perform may include fetching a first task with said first memory and delivering the first task to the processor for processing the first task. The operations may further include prefetching a second task with the first memory while the processor is processing the first task. The operations may further include the first memory delivering the second task to the processor upon completion of processing the first task. The operations may further include the processor processing the second task.

To aid in understanding the present disclosure, FIG. 1 illustrates a memory stack 100 in accordance with embodiments of the present disclosure. The memory stack 100 includes memory die 110a, 110b, 110c, 110d, 110e, 110f, and 110g stacked in memory layers 110. A vertical interconnect 112 connects the memory die 110a, 110b, 110c, 110d, 110e, 110f, and 110g to a buffer die 120. A vertical interconnect 112 may be, for example, a microbump, pillar, or direct pad-to-pad bond. The buffer die 120 may have one or more buffer segments 120a, 120b, and 120c. The memory stack 100 may connect to another system (e.g., a memory chip) via a controlled collapse chip connection (C4) 130.

In some embodiments, the memory die 110a, 110b, 110c, 110d, 110e, 110f, and 110g may include one or more types of non-volatile memory. The memory die 110a, 110b, 110c, 110d, 110e, 110f, and 110g, for example, may include high-density memory. The memory die 110a, 110b, 110c, 110d, 110e, 110f, and 110g may include, for example, phase change memory and/or magnetoresistive random-access memory (MRAM).

In some embodiments, it may be preferable for memory die 110a, 110b, 110c, 110d, 110e, 110f, and 110g to use memory types with high endurance, capable of maintaining data at high temperatures, and with low latency. In some embodiments, the memory layers 110 may contain read-only data, or the memory layers 110 may contain data that is infrequently written or changed. For example, in some embodiments, a fully-developed artificial intelligence (AI) model may be stored on the memory layers 110; the AI model may be fetched, in whole or in part(s), from the memory layers 110 by one or more buffer segments 120a, 120b, and 120c to be used by a processor. In this way, a large AI model may be stored in a memory stack 110 made of slow high-density memory and the latency for using the AI model may be reduced by using fast low-density memory as buffer segments 120a, 120b, and 120c.

The buffer die 120 may include one or more buffers. In some embodiments, one buffer may be segmented into multiple buffer segments 120a, 120b, and 120c. In some embodiments, multiple buffers may be used, and each buffer may either not be segmented or may be segmented into multiple buffer segments 120a, 120b, and 120c. Multiple buffer segments 120a, 120b, and 120c may perform multiple fetches simultaneously, in tandem, or some combination thereof.

Buffer segments 120a, 120b, and 120c may be memory. In some embodiments, the buffer segments 120a, 120b, and 120c may be fast low-density memory such as, for example, static random-access memory (SRAM) or dynamic random-access memory (DRAM). In some embodiments, buffer segments 120a, 120b, and 120c may hold data while the processor is processing other data, may hold data that the processor is processing, and/or may hold data while the processor processes and re-writes the data (e.g., overwrites the pulled data with a computation). In some embodiments, the buffer segments 120a, 120b, and 120c may deliver processed data (e.g., a task computation) to the memory layers 110 for storage; in some embodiments, the buffer segments 120a, 120b, and 120c may deliver processed data to the memory layers 110 for storage and then fetch other data to deliver to the processor for processing and/or computation.

In some embodiments of the present disclosure, the memory stack 100 system may generate a first task computation in response to the processor processing the first task. The processor may send the first task computation to a first memory (e.g., a buffer or buffer segment 120a, 120b, or 120c); the first memory may accept the first task computation. The first memory may deliver the first task computation to a second memory (e.g., a memory stack 110 or memory die 110a, 110b, 110c, 110d, 110e, 110f, or 110g). In some embodiments, the first memory may be a low-density memory and the second memory may be a high-density memory. In some embodiments, the second memory may be integrated in a three-dimensional stack of memory (e.g., a memory stack) wherein the three-dimensional stack of memory comprises a plurality of memory layers (e.g., memory die 110a, 110b, 110c, 110d, 110e, 110f, and 110g).

Figure 2:
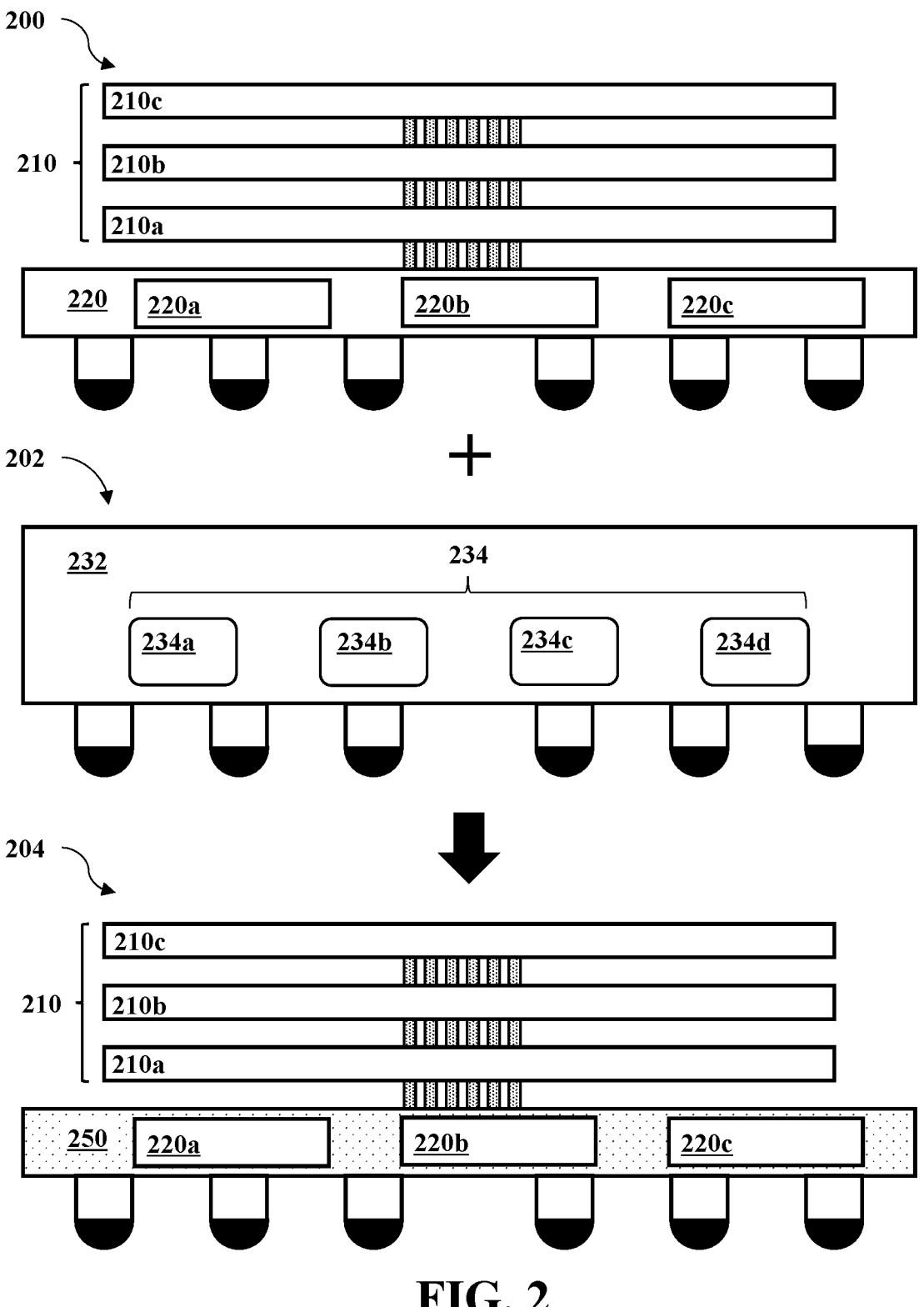
FIG. 2 depicts a memory stack with integrated artificial intelligence in accordance with embodiments of the present disclosure.

In some embodiments of the present disclosure, the first memory is a buffer, the buffer is in a buffer die, and the buffer die has artificial intelligence cores. FIG. 2 depicts an AI-integrated memory stack 204 and components thereof in accordance with embodiments of the present disclosure.

A memory stack 200 may have memory die layers 210 including one or more memory die 210a, 210b, and 210c. The memory stack 200 may also have a buffer die 220 with one or more buffer segments 220a, 220b, and 220c. The memory stack 200 may be combined with an AI unit 202. The AI unit 202 may include an AI accelerator 232 with an AI core set 234. The AI core set may have multiple AI cores 234a, 234b, 234c, and 234d. One or more of the AI cores may include, for example, scratchpads (e.g., digital scratchpads and/or scratchpad memories); in some embodiments, scratchpads may include multiple buffering (e.g., double buffering) to reduce or hide latency. The AI accelerator 232 may be integrated into the buffer die 220 to form an AI-enabled buffer die 250. In some embodiments, an AI-enabled buffer die 250 may include AI acceleration as well as compute capabilities (e.g., it may include a processor).

Figure 3A:
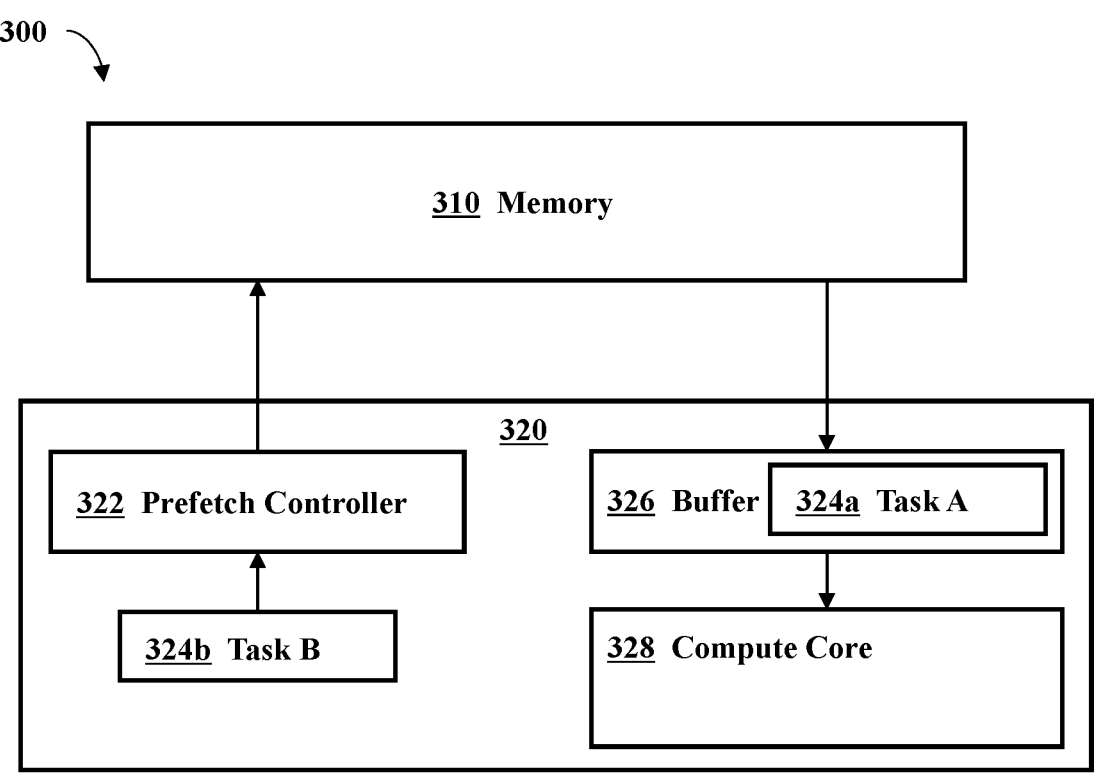
FIG. 3a illustrates a memory system in accordance with embodiments of the present disclosure.

In some embodiments, a buffer die and compute die may be combined. FIG. 3a illustrates a memory system 300 in accordance with such embodiments of the present disclosure. A memory 310 is shown in communication with a compute die 320. A buffer 326 in the compute die 320 has fetched task A 324a to deliver it to a compute core 328. Meanwhile, a prefetch controller 322 directs the prefetching of task B 324b from the memory 310.

Figure 3B:
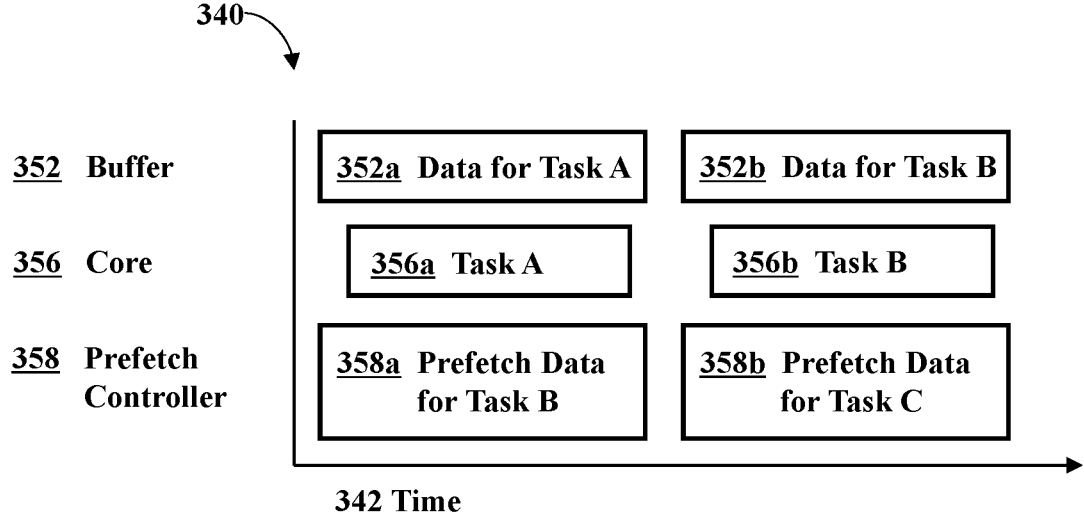
FIG. 3b illustrates a timeline of tasks completed by a memory system in accordance with embodiments of the present disclosure.

FIG. 3b illustrates a graphical timeline 340 of tasks completed by the memory system 300 in accordance with embodiments of the present disclosure. The graphical timeline 340 shows tasks completed over a period of time 342 (x-axis). The work of each component of the memory system 300 is identified by the name of the component (listed on the y-axis), and the tasks the components perform are shown on the graph.

The buffer 326 performs buffer work 352, which may also be referred to as work completed by the buffer. Buffer work 352 may include fetching (or prefetching) and containing the data for task A 352a. Buffer work 352 may also include prefetching (or fetching) and containing the data for task B 352b. The compute core 328 performs core work 356, which may also be referred to as work completed by the compute core. Core work 356 includes performing task A 356a and performing task B 356b. The prefetch controller 322 performs prefetch controller work 358, which may also be referred to as work performed by the prefetch controller. Prefetch controller work 358 may include triggering the prefetch of the data for task B 358a and triggering the prefetch of the data for task C 358b.

The data for task A 352a may be held in the buffer 326 before, during, and/or after the compute core 328 performs task A 356a. In some embodiments, the compute core 328 may receive the data for task A 356a from the buffer 326 for computations and thereby make the buffer 326 available to perform other tasks. In such embodiments, the compute core 328 may deliver the results of completed task A 356a (e.g., processed data) to the same buffer 326 (or buffer segment) or a different buffer (or buffer segment) for transfer to storage memory (e.g., memory 310 or a different memory that may use the processed data for another task).

In some embodiments, both the buffer 326 and an AI accelerator may be integrated into the compute die 320. An AI accelerator may have its own subunit within the compute die 320 or may be integrated into another component (e.g., it may be integrated into the buffer 326).

Figure 4A:
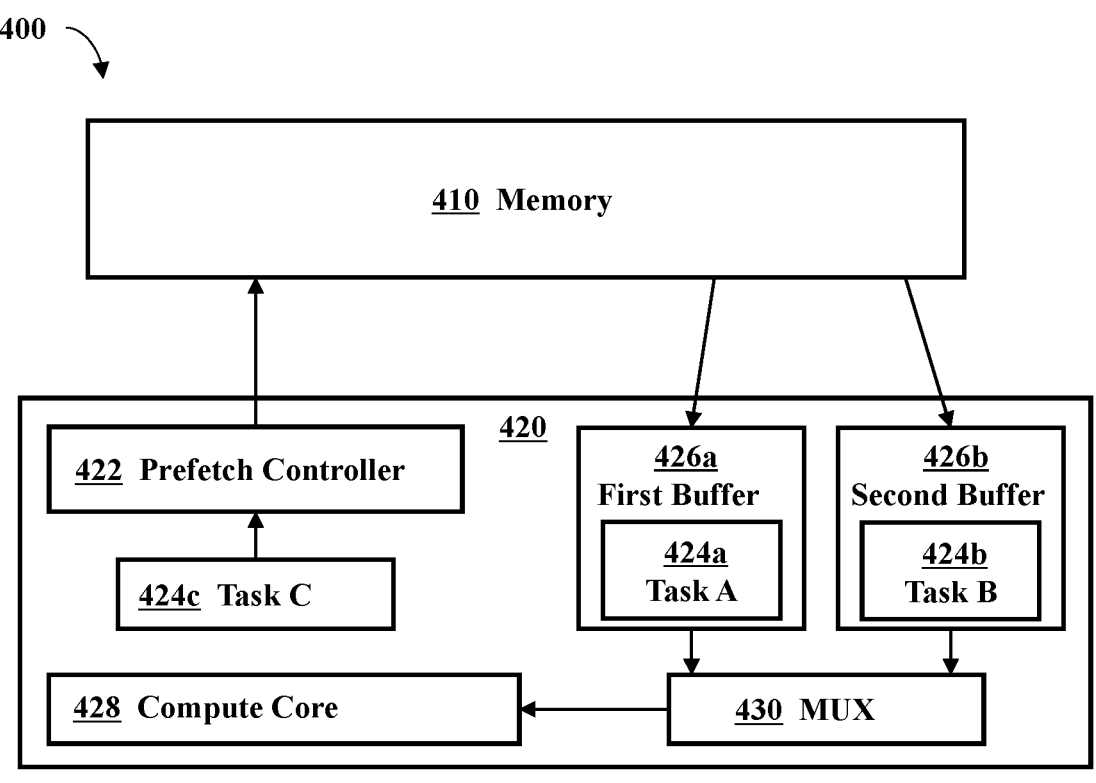
FIG. 4a illustrates a memory system in accordance with embodiments of the present disclosure.

In some embodiments, alternating work (e.g., fetching data) between a first buffer (or segment) and a second buffer (or segment) may be used. A buffer unit alternating work between buffers (or buffer segments) may be referred to as a ping-pong buffer. FIG. 4a illustrates a memory system 400 in accordance with such embodiments of the present disclosure.

A memory 410 is shown in communication with a compute die 420. A first buffer 426a (or buffer segment) in the compute die 420 has fetched task A 424a to deliver it to a compute core 428, and a second buffer 426b in the compute die 420 has prefetched task B 424*b* to deliver it to the compute core 428. A multiplexer (MUX) 430 may direct data traffic, and a prefetch controller 422 may direct the prefetching of task C 424*c* from the memory 410.

The MUX 430 may order and direct data from the first buffer 426*a* and the second buffer 424*b*. The MUX 430 may, for example, submit task A 424*a* from first buffer 426*a* to the compute core 428 first and submit task B 424*b* from second buffer 426*b* to the compute core 428 second. The MUX 430 may wait until one task is completed before submitting another task. The MUX 430 may also direct the data resulting from a task (e.g., processed data, such as the computation resulting from a task) to a buffer (e.g., first buffer 426*a* and/or second buffer 426*b*) which may, in turn, deliver it to a storage memory (e.g., memory 410 or an external memory). The MUX 430 may, alternatively or additionally, direct the buffer to deliver the data resulting from the completed task a different processor (e.g., a compute core in a connected or separate system). A different processor may use the data resulting from a task to compute other data; for example, processed data may be forwarded to another system as input data for another computation.

A ping-pong buffer may include one buffer (or buffer segment) fetching a task while a processor is working on another task and is therefore not yet ready to accept the new task. Fetching a task before a processor is ready to compute the task may be referred to as a prefetch.

Figure 4B:
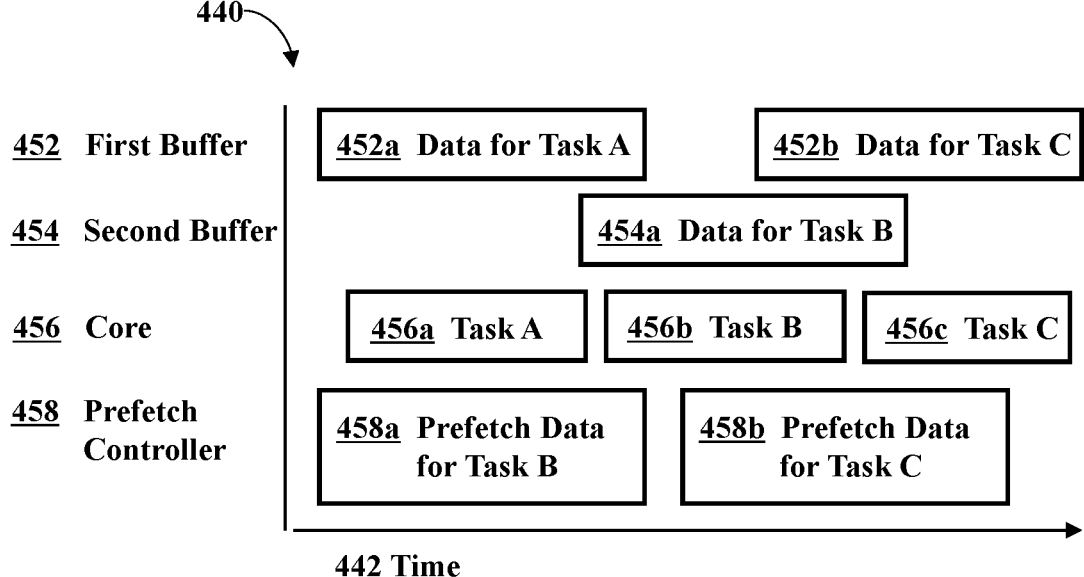
FIG. 4b illustrates a timeline of tasks completed by a memory system in accordance with embodiments of the present disclosure.

FIG. 4*b* illustrates a graphical timeline 440 of tasks completed by the memory system 400 in accordance with embodiments of the present disclosure. The graphical timeline 440 shows tasks completed over a period of time 442 (x-axis). The work of each component of the memory system 400 is identified by the name of the component (listed on the y-axis), and the tasks the components perform are shown on the graph.

The first buffer 426*a* performs first buffer work 452, which may also be referred to as work completed by the first buffer. First buffer work 452 may include fetching (or prefetching) and containing the data for task A 452*a*. First buffer work 452 may also include prefetching (or fetching) and containing the data for task C 452*c*. The second buffer 426*b* performs second buffer work 454, which may also be referred to as work completed by the second buffer. Second buffer work 454 may include fetching (or prefetching) and containing the data for task B 452*a*.

The compute core 428 performs core work 456, which may also be referred to as work completed by the compute core. Core work 456 includes performing task A 456*a*, performing task B 456*b*, and performing task C 456*c*. The prefetch controller 422 performs prefetch controller work 458, which may also be referred to as work performed by the prefetch controller. Prefetch controller work 458 may include triggering the prefetch of the data for task B 458*a* and triggering the prefetch of the data for task C 458*b*.

The data for task A 452*a* may be held in the first buffer 426*a* before, during, and/or after the compute core 428 performs task A 456*a*. In some embodiments, the compute core 428 may receive the data for task A 456*a* from the first buffer 426 for computations and thereby make the buffer 426 available to perform other tasks. In such embodiments, the compute core 428 may deliver the results of completed task A 456*a* (e.g., processed data) to the same first buffer 426*a* (or buffer segment) or a different buffer (or buffer segment) for transfer to storage memory (e.g., memory 410 or a different memory that may use the processed data for another task).

In some embodiments, a ping-pong buffer may be preferred to lower latency realized by an end user. For example, memory 410 may be slow high-density memory which may cause retrieval of data to require several seconds; alternating work permits the compute core 428 to perform work on task A 452*a* in first buffer 426*a* while second buffer 426*b* prefetches task B 452*b* such that task B 452*b* is retrieved and prepared for the compute core 428 to work on it immediately after completing task A 452*a*. In such embodiments, the first buffer 426*a* may deliver the computation to its destination and prefetch task C 424*c*.

In some embodiments of the present disclosure, the buffer may be a first memory which has a first buffer segment and a second buffer segment. The first buffer segment may fetch the first task and the second buffer segment may prefetch the second task. The second buffer segment may fetch the second task while the processor is processing the first task.

Figures 5A, 5B:
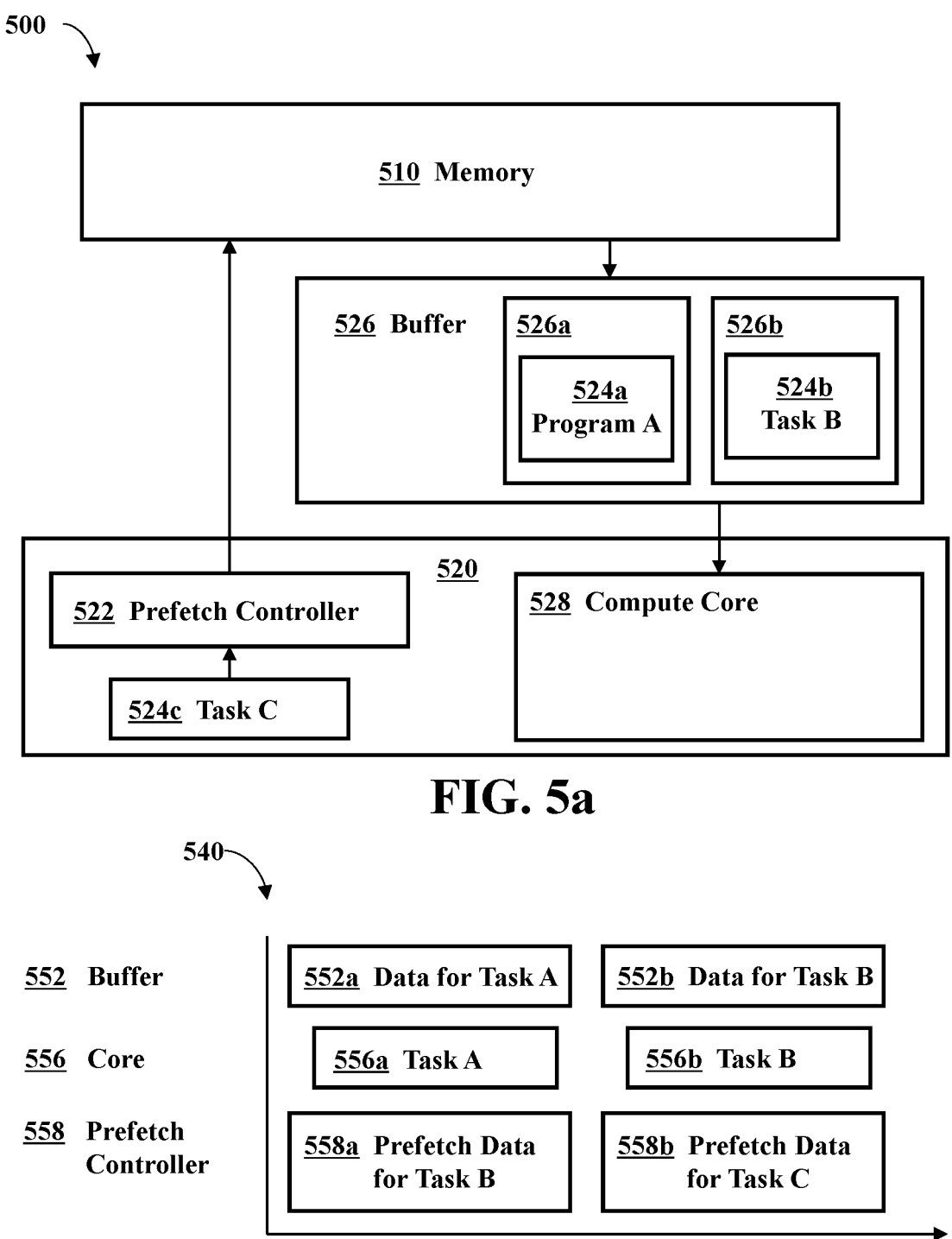
FIG. 5a illustrates a memory system in accordance with embodiments of the present disclosure.
FIG. 5b illustrates a timeline of tasks completed by a memory system in accordance with embodiments of the present disclosure.

In some embodiments, a buffer and compute core may be on separate dies. FIG. 5*a* illustrates a memory system 500 in accordance with such embodiments of the present disclosure. A memory 510 is shown in communication with a buffer die 526 and a compute die 520. The buffer die 526 is in communication with the compute die 520.

The buffer die 526 has a first buffer segment 526*a* and a second buffer segment 526*b*. Each buffer segment has fetched tasks which may be delivered to a processor or compute core 528 for processing and/or computation. The first buffer segment 526*a* fetched task A 524*a* to deliver it to a compute core 528, and the second buffer segment 526*b* fetched task B 524*b* to deliver it to the compute core 528. Meanwhile, a prefetch controller 522 directs the prefetching of task C 524*c* from the memory 510.

A MUX (not shown) may be used to order and direct data traffic to and/or from the buffer segments to the compute core 528. In some embodiments, the MUX may direct the buffer to return processed data (e.g., a computational result) to the same memory 510; in some embodiments, the MUX may direct processed data to a different memory, another compute core, another processor, and/or other location for storage and/or use.

FIG. 5*b* illustrates timeline of tasks completed by a memory system in accordance with embodiments of the present disclosure. The graphical timeline 540 shows tasks completed over a period of time 542 (x-axis). The work of each component of the memory system 500 is identified by the name of the component (listed on the y-axis), and the tasks the components perform are shown on the graph.

The buffer 526 performs buffer work 552, which may also be referred to as work completed by the buffer. Buffer work 552 may include fetching (or prefetching) and containing the data for task A 552*a*. Buffer work 552 may also include prefetching (or fetching) and containing the data for task B 552*b*. The compute core 528 performs core work 556, which may also be referred to as work completed by the compute core. Core work 556 includes performing task A 556*a* and performing task B 556*b*. The prefetch controller 522 performs prefetch controller work 558, which may also be referred to as work performed by the prefetch controller. Prefetch controller work 558 may include triggering the prefetch of the data for task B 558*a* and triggering the prefetch of the data for task C 558*b*.

The data for task A 552*a* may be held in the buffer 526 before, during, and/or after the compute core 528 performs task A 556*a*. In some embodiments, the compute core 528 may receive the data for task A 556*a* from the buffer 526 for computations and thereby make the buffer 526 available to perform other tasks. In such embodiments, the compute core 528 may deliver the results of completed task A 556*a* (e.g., processed data) to the same buffer 526 (or buffer segment)

or a different buffer (or buffer segment) for transfer to storage memory (e.g., memory 510 or a different memory that may use the processed data for another task).

In some embodiments, both the buffer 526 and an AI accelerator may be integrated into the compute die 520. An AI accelerator may have its own subunit within the compute die 520 or may be integrated into another component (e.g., it may be integrated into the buffer 526).

Figure 6:
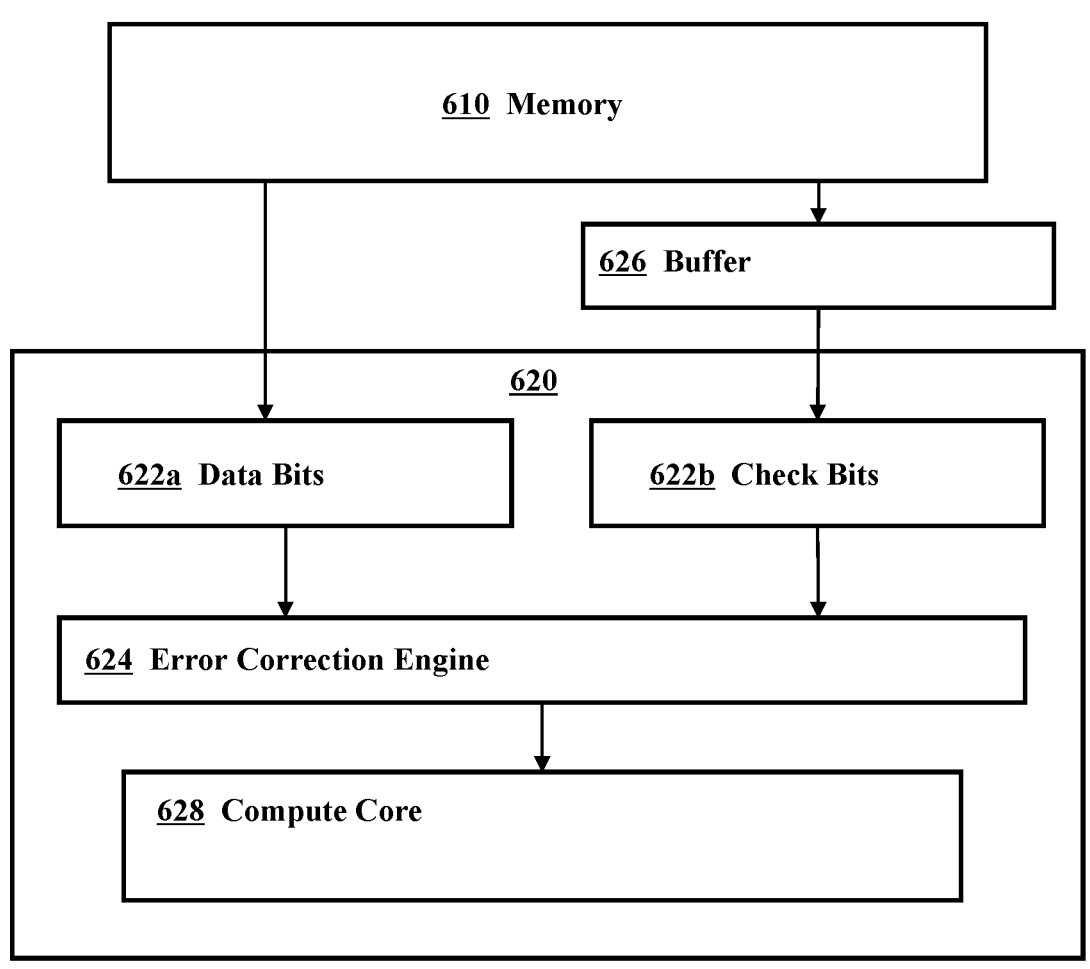
FIG. 6 depicts a memory system in accordance with embodiments of the present disclosure.

In some embodiments of the present disclosure, the system may further include an error correction engine communicating with the memory and the processor. FIG. 6 depicts a memory system 600 in accordance with such embodiments of the present disclosure.

A memory 610 is shown in communication with a buffer 626 and a compute die 620. The buffer 626 is in communication with the compute die 620. The memory 610 may communicate data bits 622a to the compute die 620. This communication may be done directly (as shown) or through a buffer (not shown). The memory 610 may also communicate check bits 622b to the compute die 620. This communication may be done directly (not shown) or through a buffer (as shown). FIG. 6 shows check bits 622b traveling to the compute die 620 via a buffer 626 and data bits 622a delivered directly from the memory 610 to the compute die 620.

The data bits 622a and check bits 622b are fed to an error correction engine 624. Data may be verified and, if desired, corrected before submission to a compute core 628. The error correction engine 624 may be located on a memory die, a buffer die, a compute die 620, or a different die (e.g., the die of a different memory or a dedicated error correction die). In some embodiments, data bits 622a, check bits 622b, and the error correction engine 624 may be co-located (e.g., on the same memory die, the same buffer die, the same compute die, or on a distinct error correction die).

Figure 7:
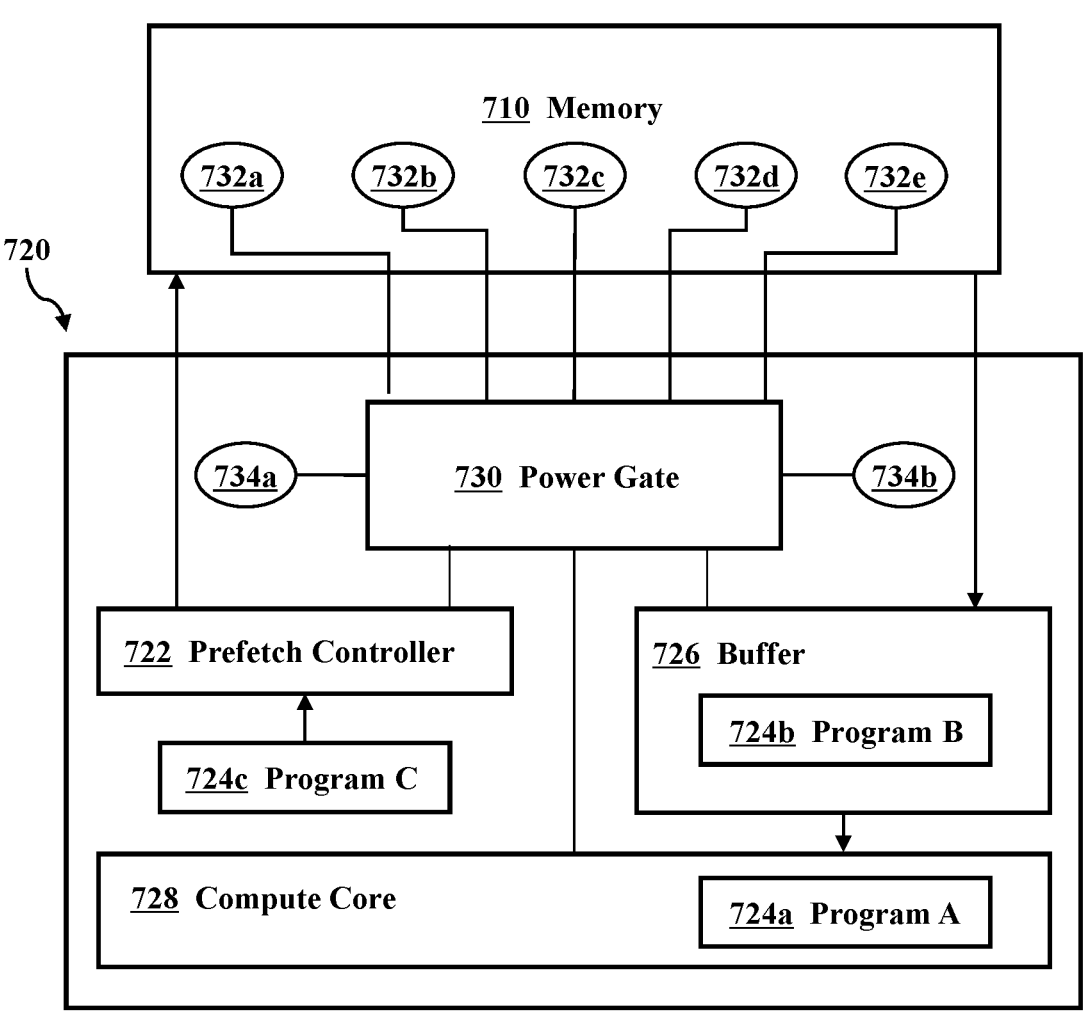
FIG. 7 illustrates a memory system in accordance with embodiments of the present disclosure.

In some embodiments of the present disclosure, sensors may be implemented to protect the system, the data the system contains, and/or one or more affiliated systems (e.g., a data collection system). For example, in some embodiments, the system may include a first temperature sensor for sensing a first temperature; the first temperature sensor may be in communication with a power gate wherein the power gate throttles power if a first temperature threshold is reached. In some embodiments, the system may further include a second temperature sensor for sensing a second temperature in communication with the power gate. The power gate may throttle if a second temperature threshold is reached. The power gate may be in connection with any number of components and may throttle power to one or more of them (e.g., just a buffer or an entire system) based on temperature thresholds. FIG. 7 illustrates a memory system 700 in accordance with such embodiments of the present disclosure.

A memory 710 is shown in communication with a prefetch controller 722, a buffer 726, and a power gate 730 on a buffer die 720. The buffer 726 is in communication with the compute core 728. The memory 710 may submit programs to the compute core 728 via the buffer 726. FIG. 7 shows compute core 728 working on program A 724a and buffer 726 containing program B 724b. The prefetch controller 722 is submitting a prefetch request for program C 724c to the memory.

The memory 710 is embedded with temperature sensors 732a, 732b, 732c, 732d, and 732e in communication with the power gate 730. Similarly, the buffer die 720 is embedded with temperature sensors 734a and 734b in communication with the power gate 730. Temperature sensors 732a, 732b, 732c, 732d, and 732e in the memory 710 may be dispersed evenly throughout the memory 710 or concentrated in one or more bellwether regions (e.g., regions expected to most quickly reach a certain temperature or threshold). Similarly, temperature sensors 734a and 734b in the buffer die 710 may be dispersed evenly throughout the buffer die 720 or concentrated in one or more bell weather regions (e.g., regions expected to most quickly reach a certain temperature or threshold). The number of temperature sensors 732a, 732b, 732c, 732d, 732e, 734a, and 734b in the system 700 and placement thereof may vary depending on the system, its components, risk tolerance, and user preferences.

The power gate 730 may throttle (e.g., limit, increase, or eliminate) power provision to any, some, or all of the components in the system 700. Power throttling may be a result of manual (e.g., user command) or automated (e.g., reaching a threshold) commands. An example of a manual command is that a user may identify a reason to turn off the system 700 and manually direct the power gate 730 to discontinue power to the system 700. An example of an automated command is that temperature sensor 734b may indicate to the power gate 730 that the temperature adjacent the buffer 726 exceeds a safety temperature threshold and the power gate 730 may reduce power provisioned to the buffer 726.

In some embodiments, threshold temperatures may be consistent throughout a system. For example, the power gate 730 may reduce power to the system or any component thereof if any of the temperature sensors 732a, 732b, 732c, 732d, 732e, 734a, or 734b exceed a threshold of 90° Celsius. In some embodiments, threshold temperatures may be set specific to relevant components. For example, memory 710 may be able to tolerate (e.g., operate at) higher temperatures than the buffer 726; in such a case, the temperature sensors 732a, 732b, 732c, 732d, and 732e in the memory 710 may have a threshold temperature of 120° Celsius whereas the temperature sensors 734a and 734b in the buffer die 710 may have a temperature threshold of 80° Celsius. If different components are held within different areas of the buffer die 720 and each component has different temperature tolerances, the temperature thresholds of temperature sensors 734a and 734b may be distinct from one another. Similarly, if different components are held within different areas of the memory die 710 have different temperature tolerances, the temperature thresholds of temperature sensors 732a, 732b, 732c, 732d, 732e, 734a, or 734b may differ from sensor to sensor.

Thresholds may be set based on the material the system 700 includes and how the system 700 is constructed. For example, if the memory cells used in memory 710 operate safely from 5° Celsius through 75° Celsius, the power gate 730 may trigger power throttling if one or more of the temperature sensors 732a, 732b, 732c, 732d, and 732e in the memory 710 reach 76° Celsius or falls below 5° Celsius. In some embodiments, the memory cells used in memory 710 may be selected for their enhanced heat resistance (e.g., the ability to safely operate at increased temperatures); if the memory cells used in memory 710 operate safely from 5° Celsius through 125° Celsius, the power gate 730 may trigger power throttling if one or more of the temperature sensors 732a, 732b, 732c, 732d, and 732e in the memory 710 reach 126° Celsius or falls below 5° Celsius.

Similarly, temperature thresholds for the buffer die 720 and other components may likewise be set. For example, a buffer 726 that operates safely from 0° Celsius through 50° Celsius may have throttling thresholds set to stop provision of power if either of temperature sensors 734a or 734b receive a temperature reading exceeding 50° Celsius or falling below 0° Celsius. Likewise, temperature may also be sensed on or near the compute core 728, prefetch controller 722, power gate 730, and other components of the system 700, and thresholds for throttling may reflect the specific operating tolerances of various components.

In some embodiments of the disclosure, temperature may be sensed and/or tracked in or near various components of the system 700 and the throttling threshold temperature may be the same for all of the components. For example, a user may set a uniform throttling threshold temperature of 45° Celsius for any sensor in the system. Temperature thresholds may be set automatically (e.g., preset thresholds the same for any system), semi-autonomously (e.g., the system specifications are used to automatically load temperature thresholds for the particular system and/or components thereof), manually (e.g., a user may enter one or more temperature thresholds), or some combination thereof.

In some embodiments, thresholds may be set based on the material the system 700 includes, how the system 700 is constructed, and the geometry of the system. For example, certain memory cells may be able to operate at a higher than standard temperature for up to three seconds such that the integrity of the memory cells are preserved if the temperature falls within the standard temperature range within three seconds. In such an instance, memory cells located in a well-ventilated flat memory geometry may cool more quickly than the memory cells in a memory stack (see FIG. 1); thus, the temperature thresholds associated with the temperature sensors 732a, 732b, 732c, 732d, and 732e in the flat memory geometry may trigger only after reaching an excessive temperature in excess of three seconds whereas the temperature sensors 732a, 732b, 732c, 732d, and 732e in the memory stack may trigger immediately.

The present disclosure may be implemented in a variety of systems, including, but not limited to, on-site hardwired memory storage, memory storage accessed via the cloud, analog storage, and digital storage. The present disclosure may enable faster memory access for any system which may use a memory and a compute; the memory and the compute may communicate integrally and directly (e.g., part of one physical computer system), via a local connection (e.g., a local area network), via a private connection (e.g., a virtual private network), or some other connection (e.g., a wide area network or the internet).

It is to be understood that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model with different physical and virtual resources dynamically assigned and reassigned according to demand. There is a sense of portion independence in that the consumer generally has no control or knowledge over the exact portion of the provided resources but may be able to specify portion at a higher level of abstraction (e.g., country, state, or datacenter).

Rapid elasticity: capabilities can be rapidly and elastically provisioned, in some cases automatically, to quickly scale out and rapidly release to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but the consumer has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software which may include operating systems and applications. The consumer does not manage or control the underlying cloud infrastructure but has control over operating systems, storage, and deployed applications, and the consumer possibly has limited control of select networking components (e.g., host firewalls).

Deployment models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and/or compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 8:
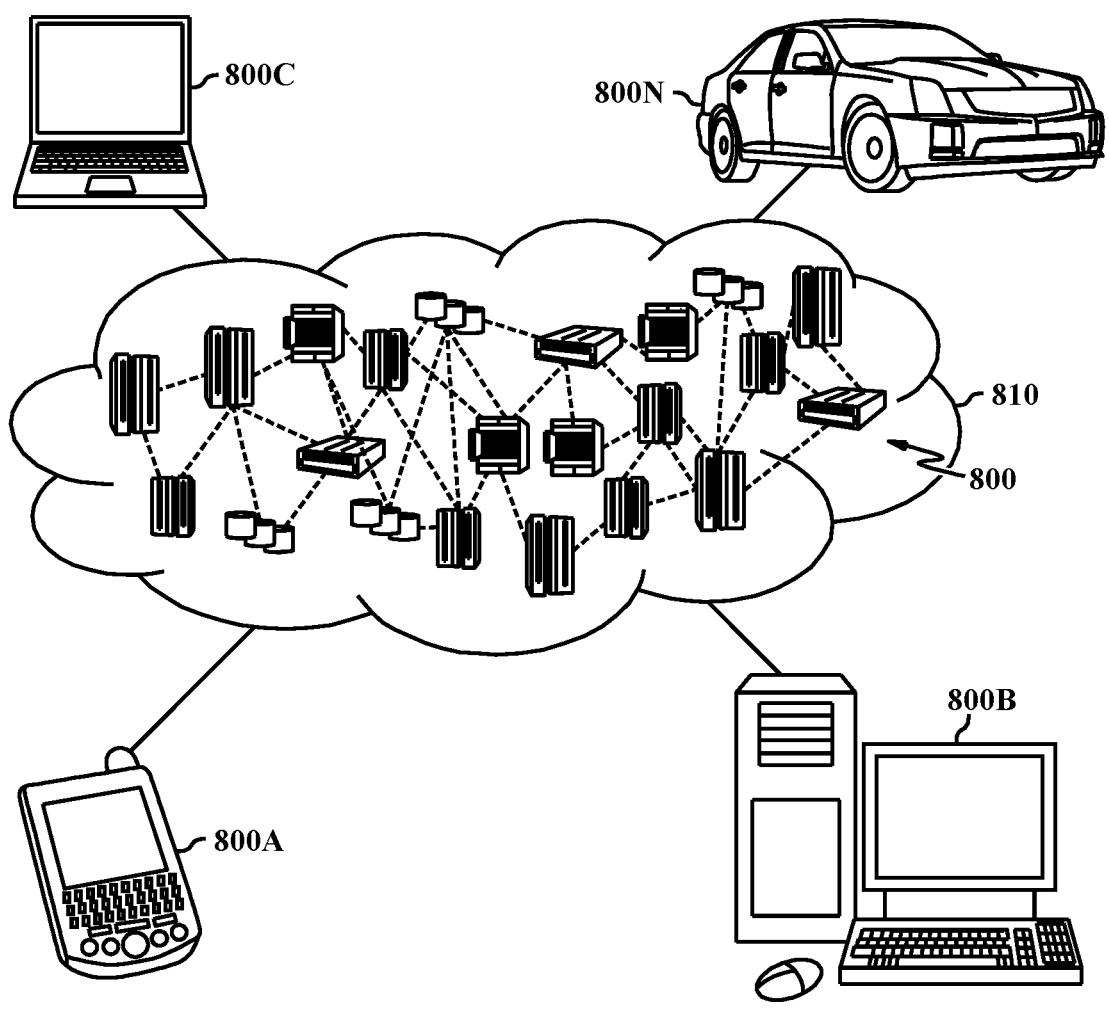
FIG. 8 illustrates a cloud computing environment, in accordance with embodiments of the present disclosure.

FIG. 8 illustrates a cloud computing environment 810 in accordance with embodiments of the present disclosure. As shown, cloud computing environment 810 includes one or more cloud computing nodes 800 with which local computing devices used by cloud consumers such as, for example, personal digital assistant (PDA) or cellular telephone 800A, desktop computer 800B, laptop computer 800C, and/or automobile computer system 800N may communicate. Nodes 800 may communicate with one another. They may be grouped (not shown) physically or virtually, in one or more networks, such as private, community, public, or hybrid clouds as described hereinabove, or a combination thereof.

This allows cloud computing environment 810 to offer infrastructure, platforms, and/or software as services for which a cloud consumer does not need to maintain resources on a local computing device. It is understood that the types of computing devices 800A-N shown in FIG. 8 are intended to be illustrative only and that computing nodes 800 and cloud computing environment 810 can communicate with any type of computerized device over any type of network and/or network addressable connection (e.g., using a web browser).

Figure 9:
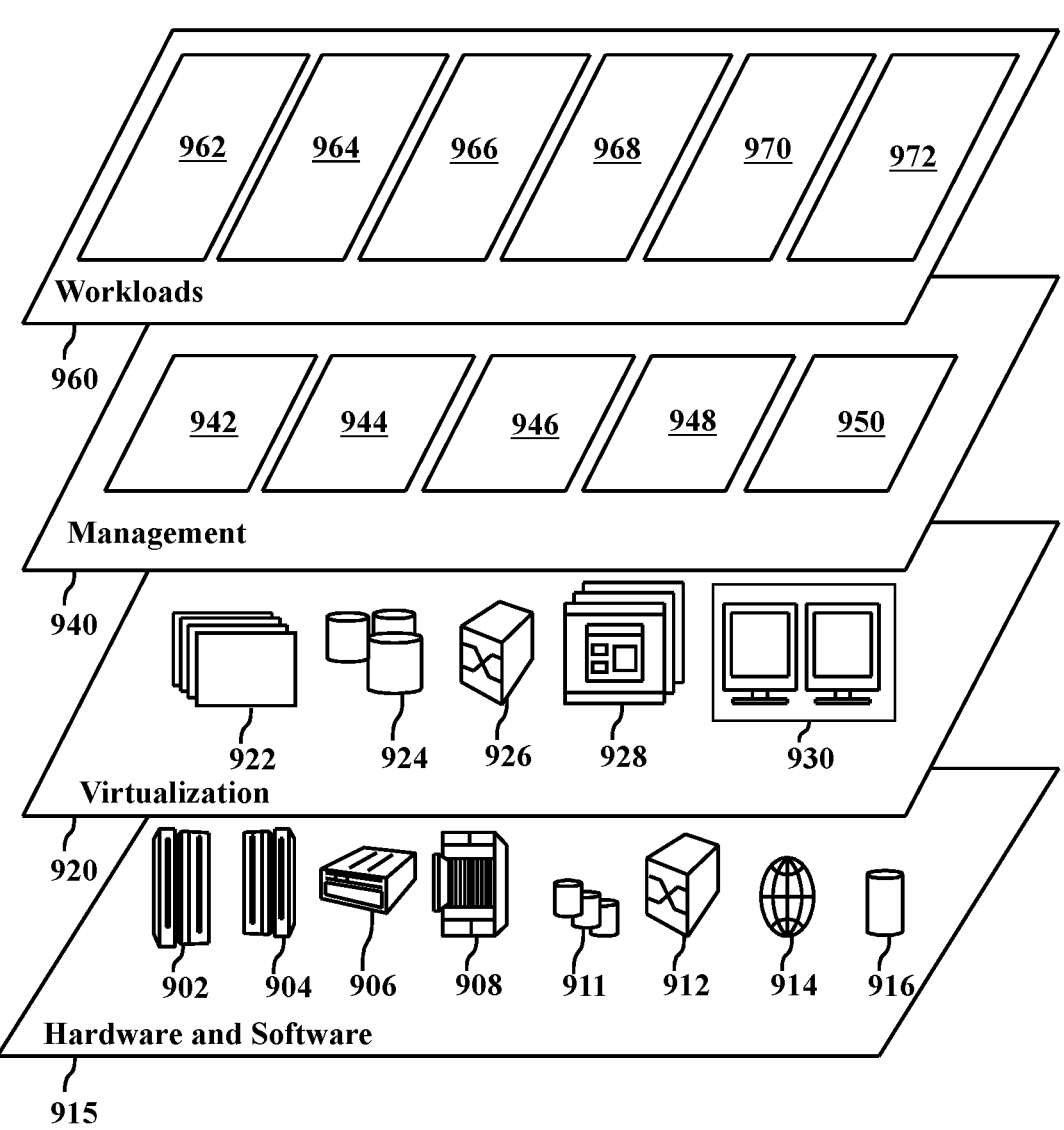
FIG. 9 depicts abstraction model layers, in accordance with embodiments of the present disclosure.

FIG. 9 illustrates abstraction model layers 900 provided by cloud computing environment 810 (of FIG. 8) in accordance with embodiments of the present disclosure. It should be understood in advance that the components, layers, and functions shown in FIG. 9 are intended to be illustrative only and embodiments of the disclosure are not limited thereto. As depicted below, the following layers and corresponding functions are provided.

Hardware and software layer 915 includes hardware and software components. Examples of hardware components include: mainframes 902; RISC (Reduced Instruction Set Computer) architecture-based servers 904; servers 906; blade servers 908; storage devices 911; and networks and networking components 912. In some embodiments, software components include network application server software 914 and database software 916.

Virtualization layer 920 provides an abstraction layer from which the following examples of virtual entities may be provided: virtual servers 922; virtual storage 924; virtual networks 926, including virtual private networks; virtual applications and operating systems 928; and virtual clients 930.

In one example, management layer 940 may provide the functions described below. Resource provisioning 942 provides dynamic procurement of computing resources and other resources that are utilized to perform tasks within the cloud computing environment. Metering and pricing 944 provide cost tracking as resources and are utilized within the cloud computing environment as well as billing or invoicing for consumption of these resources. In one example, these resources may include application software licenses. Security provides identity verification for cloud consumers and tasks as well as protection for data and other resources. User portal 946 provides access to the cloud computing environment for consumers and system administrators. Service level management 948 provides cloud computing resource allocation and management such that required service levels are met. Service level agreement (SLA) planning and fulfillment 950 provide pre-arrangement for, and procurement of, cloud computing resources for which a future requirement is anticipated in accordance with an SLA.

Workloads layer 960 provides examples of functionality for which the cloud computing environment may be utilized. Examples of workloads and functions which may be provided from this layer include: mapping and navigation 962; software development and lifecycle management 974; virtual classroom education delivery 966; data analytics processing 968; transaction processing 970; and one or more NVM-based high-capacity neural network inference engine 972.

It is to be understood that although this disclosure includes a detailed description on cloud computing, implementation of the teachings recited herein are not limited to a cloud computing environment. Rather, embodiments of the present disclosure are capable of being implemented in conjunction with any other type of computing environment currently known or which may be later developed.

Figure 10:
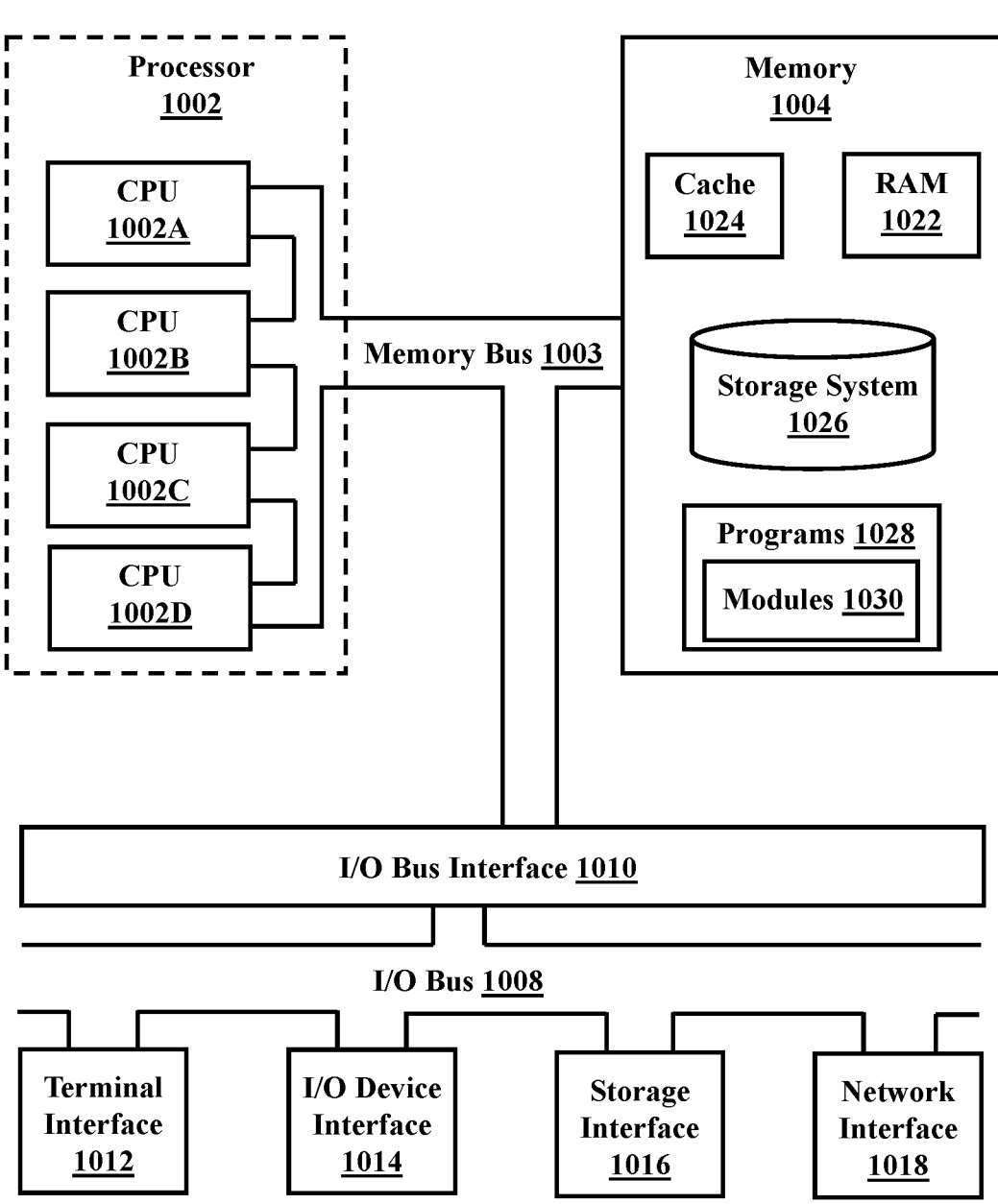
FIG. 10 illustrates a high-level block diagram of an example computer system that may be used in implementing one or more of the methods, tools, and modules, and any related functions, described herein, in accordance with embodiments of the present disclosure.

FIG. 10 illustrates a high-level block diagram of an example computer system 1001 that may be used in implementing one or more of the methods, tools, and modules, and any related functions, described herein (e.g., using one or more processor circuits or computer processors of the computer) in accordance with embodiments of the present disclosure. In some embodiments, the major components of the computer system 1001 may comprise a processor 1002 with one or more central processing units (CPUs) 1002A, 1002B, 1002C, and 1002D, a memory subsystem 1004, a terminal interface 1012, a storage interface 1017, an I/O (Input/Output) device interface 1014, and a network interface 1018, all of which may be communicatively coupled, directly or indirectly, for inter-component communication via a memory bus 1003, an I/O bus 1008, and an I/O bus interface unit 1010.

The computer system 1001 may contain one or more general-purpose programmable CPUs 1002A, 1002B, 1002C, and 1002D, herein generically referred to as the CPU 1002. In some embodiments, the computer system 1001 may contain multiple processors typical of a relatively large system; however, in other embodiments, the computer system 1001 may alternatively be a single CPU system. Each CPU 1002 may execute instructions stored in the memory subsystem 1004 and may include one or more levels of on-board cache.

System memory 1004 may include computer system readable media in the form of volatile memory, such as random access memory (RAM) 1022 or cache memory 1024. Computer system 1001 may further include other removable/non-removable, volatile/non-volatile computer system storage media. By way of example only, storage system 1027 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM, or other optical media can be provided. In addition, memory 1004 can include flash memory, e.g., a flash memory stick drive or a flash drive. Memory devices can be connected to memory bus 1003 by one or more data media interfaces. The memory 1004 may include at least one program product having a set (e.g., at least one) of program modules that are configured to carry out the functions of various embodiments.

One or more programs/utilities 1028, each having at least one set of program modules 830, may be stored in memory 1004. The programs/utilities 1028 may include a hypervisor (also referred to as a virtual machine monitor), one or more operating systems, one or more application programs, other program modules, and program data. Each of the operating systems, one or more application programs, other program modules, and program data, or some combination thereof, may include an implementation of a networking environment. Programs 1028 and/or program modules 1030 generally perform the functions or methodologies of various embodiments.

Although the memory bus 1003 is shown in FIG. 10 as a single bus structure providing a direct communication path among the CPUs 1002, the memory subsystem 1004, and the I/O bus interface 1010, the memory bus 1003 may, in some embodiments, include multiple different buses or communication paths, which may be arranged in any of various forms, such as point-to-point links in hierarchical, star, or web configurations, multiple hierarchical buses, parallel and redundant paths, or any other appropriate type of configuration. Furthermore, while the I/O bus interface 1010 and the I/O bus 1008 are shown as single respective units, the computer system 1001 may, in some embodiments, contain multiple I/O bus interface units 1010, multiple I/O buses 1008, or both. Further, while multiple I/O interface units 1010 are shown, which separate the I/O bus 1008 from various communications paths running to the various I/O devices, in other embodiments some or all of the I/O devices may be connected directly to one or more system I/O buses 1008.

In some embodiments, the computer system 1001 may be a multi-user mainframe computer system, a single-user system, a server computer, or similar device that has little or no direct user interface but receives requests from other computer systems (clients). Further, in some embodiments, the computer system 1001 may be implemented as a desktop computer, portable computer, laptop or notebook computer, tablet computer, pocket computer, telephone, smartphone, network switches or routers, or any other appropriate type of electronic device.

It is noted that FIG. 10 is intended to depict the representative major components of an exemplary computer system 1001. In some embodiments, however, individual components may have greater or lesser complexity than as represented in FIG. 10, components other than or in addition to those shown in FIG. 10 may be present, and the number, type, and configuration of such components may vary.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), SRAM, a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide, or other transmission media (e.g., light pulses passing through a fiber-optic cable) or electrical signals transmitted through a wire.

Computer readable program instructions described herein can be downloaded to respective computing/processing devices from a computer readable storage medium or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer, or entirely on a remote computer or server. In the latter scenario, the remote computer may be connected to the user's computer through any type of network, including a local area network (LAN) or a wide area network (WAN) or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions which comprises one or more executable instructions for implementing the specified logical function(s). In some alternative implementations, the functions noted in the blocks may occur out of the order noted in the figures. For example, two blocks shown in succession may, in fact, be accomplished as one step, executed concurrently, substantially concurrently, in a partially or wholly temporally overlapping manner, or the blocks may sometimes be executed in the reverse order depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although the present disclosure has been described in terms of specific embodiments, it is anticipated that alterations and modification thereof will become apparent to the skilled in the art. The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or the technical improvement over technologies found in the marketplace or to enable others of ordinary skill in the art to understand the embodiments disclosed herein. Therefore, it is intended that the following claims be interpreted as covering all such alterations and modifications as fall within the true spirit and scope of the disclosure.

What is claimed is:

1. A computer system comprising:
a memory stack comprising a buffer die and a plurality of memory dies, including a first memory die, wherein:
the buffer die and each memory die of the plurality of memory dies are connected via vertical interconnect; and
the buffer die comprises artificial intelligence cores, a first buffer segment, and a second buffer segment;
a processor set;
one or more computer readable storage media; and
program instructions stored on the one or more computer readable storage media to cause the processor to perform operations comprising:
fetching a first task from the first memory die;
delivering, by the first buffer segment, the first task to said processor;
prefetching, with the second buffer segment, a second task from a memory die of the plurality of memory dies while the processor is processing the first task;
delivering, by the second buffer segment and upon completion of processing the first task, the second task to the processor; and
processing, by the processor, the second task.

2. The computer system of claim 1, wherein the operations further comprise:
responsive to the processor processing the first task, generating a first task computation;
sending, by the processor, the first task computation to the second buffer segment;
accepting, by the second buffer segment, first task computation; and
delivering the first task computation to the first memory die, wherein the first memory die is a higher-density memory than the second buffer segment.

3. The computer system of claim 2, wherein:
the first memory die is integrated in a three-dimensional stack of memory, wherein the three-dimensional stack of memory comprises the plurality of memory dies.

4. The computer system of claim 1, wherein the operations further comprise:
sensing, with a first temperature sensor located on the first memory die, a first temperature, wherein:
the first temperature sensor is in communication with a power gate; and
the power gate throttles power to the first memory responsive to a first temperature threshold being reached; and
sensing, with a second temperature sensor located on the buffer die, a second temperature.

5. The computer system of claim 4, wherein
the second temperature sensor is in communication with the power gate; and
the power gate throttles power to the first memory responsive to a second temperature threshold being reached.

6. The computer system of claim 1, wherein the operations further comprise:
communicating between an error correction engine, the first memory die, and the processor, wherein data bits and check bits for the error correction engine are co-located.

7. A computer implemented method comprising:

providing a memory stack comprising a buffer die and a plurality of memory dies, including a first memory die, wherein:

the buffer die and each memory die of the plurality of memory dies are connected via vertical interconnect; and the buffer die comprises artificial intelligence cores, a first buffer segment, and a second buffer segment;

fetching a first task from the first memory die;

delivering, by the first buffer segment, the first task to a processor;

prefetching, with the second buffer segment, a second task from a memory die of the plurality of memory dies while the processor is processing the first task;

delivering, by the second buffer segment and upon completion of processing the first task, the second task to the processor; and processing, by the processor, the second task.

8. The computer implemented method of claim 7, further comprising:

responsive to the processor processing the first task, generating a first task computation;

sending, by the processor, the first task computation to the second buffer segment;

accepting, by the second buffer segment, the first task computation; and delivering the first task computation to the first memory die, wherein the first memory die is a higher-density memory than the second buffer segment.

9. The computer implemented method of claim 8 wherein:

the first memory die is integrated in a three-dimensional stack of memory, wherein the three-dimensional stack of memory comprises the plurality of memory dies.

10. The computer implemented method of claim 7 further comprising:

sensing, with a first temperature sensor located on the first memory die, a first temperature, wherein:

the first temperature sensor is in communication with a power gate; and the power gate throttles power to the first memory responsive to a first temperature threshold being reached; and sensing, with a second temperature sensor located on the buffer die, a second temperature.

11. The computer implemented method of claim 10, wherein;

the second temperature sensor is in communication with the power gate; and the power gate throttles power to the first memory responsive to a second temperature threshold being reached.

12. The computer implemented method of claim 7, further comprising:

communicating between an error correction engine, the first memory die, and the processor, wherein data bits and check bits for the error correction engine are co-located.

13. A computer program product comprising:

one or more computer readable storage media; and program instructions stored on the one or more computer readable storage media to perform operations comprising:

providing a memory stack comprising a buffer die and a plurality of memory dies, including a first memory die, wherein:

the buffer die and each memory die of the plurality of memory dies are connected via vertical interconnect; and the buffer die comprises artificial intelligence cores, a first buffer segment, and a second buffer segment;

fetching a first task from the first memory die;

delivering, by the first buffer segment, the first task to a processor;

prefetching, with the second buffer segment, a second task from a memory die of the plurality of memory dies while the processor is processing the first task;

delivering, by the second buffer segment and upon completion of processing the first task, the second task to the processor; and processing, by the processor, the second task.

14. The computer program product of claim 13, wherein the operations further comprise:

responsive to the processor processing the first task, generating a first task computation;

sending, by the processor, the first task computation to the second buffer segment;

accepting, by the second buffer segment, the first task computation; and delivering the first task computation to the first memory die, wherein the first memory die is a higher-density memory than the second buffer segment.

15. The computer program product of claim 13, wherein the operations further comprise:

sensing, with a first temperature sensor located on the first memory die, a first temperature, wherein:

the first temperature sensor is in communication with a power gate; and the power gate throttles power to the first memory responsive to a first temperature threshold being reached; and sensing, with a second temperature sensor located on the buffer die, a second temperature.

16. The computer system of claim 1, wherein the processor is in the buffer die.

17. The computer system of claim 1, wherein the operations further comprise:

holding the second task in the second buffer segment while the processor is processing the first task.

18. The computer system of claim 1, wherein the processor receives the first task from the first buffer segment.

* * * * *